United States Patent
Dono et al.

(10) Patent No.: US 8,400,184 B2
(45) Date of Patent: Mar. 19, 2013

(54) SEMICONDUCTOR DEVICE AND LEVEL SHIFT CIRCUIT USING THE SAME

(75) Inventors: Chiaki Dono, Tokyo (JP); Koji Kuroki, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 0 days.

(21) Appl. No.: 12/923,255

(22) Filed: Sep. 10, 2010

(65) Prior Publication Data

US 2011/0303988 A1    Dec. 15, 2011

(30) Foreign Application Priority Data

Sep. 11, 2009  (JP) ................................. 2009-210891

(51) Int. Cl.
  *H03K 19/0175*  (2006.01)
  *H03L 5/00*  (2006.01)
(52) U.S. Cl. .............................. 326/68; 326/81; 327/333
(58) Field of Classification Search .............. 326/62–63, 326/68, 80–87; 327/333
  See application file for complete search history.

(56) References Cited

U.S. PATENT DOCUMENTS

| | | | |
|---|---|---|---|
| 4,888,498 A * | 12/1989 | Kadakia | 327/546 |
| 6,556,061 B1 * | 4/2003 | Chen et al. | 327/333 |
| 6,657,459 B2 * | 12/2003 | Nishio et al. | 326/83 |
| 7,271,639 B2 * | 9/2007 | Satou et al. | 327/333 |
| 7,425,860 B2 | 9/2008 | Nomura | |
| 7,671,656 B2 | 3/2010 | Nomura | |
| 7,755,392 B1 * | 7/2010 | Ku | 326/68 |
| 7,813,159 B2 * | 10/2010 | Inaba | 365/148 |

FOREIGN PATENT DOCUMENTS

WO  WO 2004/040765 A1  5/2004

* cited by examiner

*Primary Examiner* — Thienvu Tran
(74) *Attorney, Agent, or Firm* — McGinn IP Law Group, PLLC (57) ABSTRACT

A level shift circuit includes: a pair of first and second P-channel transistors which are connected in a flip-flop manner and whose sources connected to a first power supply line; a pair of first and second N-channel transistors with the first N-channel transistor provided between the first P-channel transistor and a second power supply line and the second N-channel transistor provided between the second P-channel transistor and the second power supply line, in which input signals complementary to each other are inputted to their gates; and a current supply circuit provided between the first power supply line and a drain of the first N-channel transistor and between the first power supply line and a drain of the second N-channel transistor, respectively. The current supply circuit includes third and fourth N-channel transistors with their sources connected to drains of the first and second N-channel transistors and third and fourth P-channel transistors serving as current limiting elements with their one ends connected to the first power supply line and the other ends connected to drains of the third and fourth P-channel transistors.

13 Claims, 9 Drawing Sheets

(RELATED ART)

FIG. 9

SEMICONDUCTOR DEVICE AND LEVEL SHIFT CIRCUIT USING THE SAME

BACKGROUND OF THE INVENTION

1. Field of the Invention

The present invention relates to a semiconductor device, and particularly relates to a configuration and a layout of a level shift circuit for converting a level of an input signal into a predetermined amplitude level.

2. Description of Related Art

Recently, an operating voltage of semiconductor devices has been reduced because of downscaling of semiconductor devices. Semiconductor devices thus generate an internal operating voltage VPERI lower than an external voltage VDD supplied from outside of the device and operate based on the internal operating voltage VPERI. Signals outputted from a semiconductor device to an external device are boosted from the internal operating voltage VPERI to the external voltage VDD and the boosted signals are outputted. A level shift circuit is used for such conversion of an external voltage into an internal operating voltage.

International Publication No. WO2004/040765 (see FIGS. 2, 16, and 17 of the publication) discloses a level shift circuit configured by a pair of P-channel transistors which are connected in a flip-flop manner, a pair of first N-channel transistors that respective transistors are serially connected to the P-channel transistors and an input signal is inputted, and a pair of second N-channel transistors that respective transistors are connected in parallel to the P-channel transistors and an input signal is inputted.

SUMMARY

Figure 9:
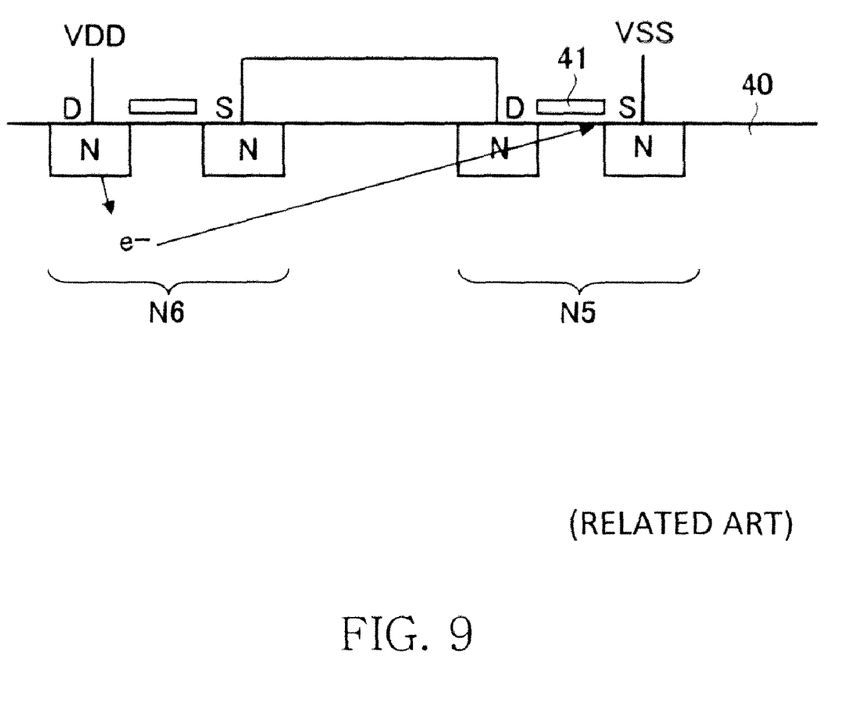
FIG. 9 is a schematic diagram showing a device structure of a conventional level shift circuit.

As a result of examinations of actual device configuration of the above level shift circuit by the present inventors, it has been found that, as shown in FIG. 9, the level shift circuit includes a serial circuit of a first N-channel transistor and a second N-channel transistor, a drain of the second N-channel transistor is connected to a power supply VDD and a source of the first N-channel transistor is connected to ground.

However, when two N-channel transistors are serially connected to the power supply VDD, the first N-channel transistor has to be spaced apart from the second N-channel transistor, which leads to an increase of a layout. This is because when a distance between a first N-channel transistor N5 and a second N-channel transistor N6 that are serially connected to the power supply VDD is short, electrons move from a drain of the second N-channel transistor N6 through a P-type substrate 40 to a gate 41 of the first N-channel transistor N5 and thus there is a possibility that a threshold voltage of the first N-channel transistor N5 varies or gate dielectric films are broken. In the following explanations, these problems are called a GCD (Gate Controlled Diode) mode failure. To avoid the GCD mode failure, the two N-channel transistors have to be spaced apart from each other. However, the layout area has to be increased in this case.

In one embodiment, there is provided a semiconductor device comprising: first and second power supply lines; a serial circuit of a first one-conductivity type transistor whose one end is connected to the power supply line and a first opposite-conductivity type transistor whose other end is connected to the other end of the first one-conductivity type transistor and whose one end is connected to the second power supply line; and a current supply circuit connected in parallel to the first one-conductivity type transistor, wherein the current supply circuit includes a current limiting element whose one end is connected to the first power supply line and a second opposite-conductivity type transistor whose other end is connected to the other end of the current limiting element and whose one end is connected to the other end of the first opposite-conductivity type transistor. When "one-conductivity type" is P-type, "opposite-conductivity type" is N-type and the potential of the first power supply line higher than that of the second power supply line. On the contrary, when "one-conductivity type" is N-type, "opposite-conductivity type" is P-type and the potential of the first power supply line lower than that of the second power supply line.

In another embodiment, there is provided a level shift circuit comprising: first and second power supply lines; a pair of first one-conductivity type transistors that are connected in a flip-flop manner and their one ends are connected to the first power supply line; a pair of first opposite-conductivity type transistors having their other ends connected to other ends of the first one-conductivity type transistors, their one ends connected to the second power supply line, and input signals complementary to each other are inputted to their gates; and a pair of current supply circuits that are respectively provided between the first power supply line and the other ends of the first opposite-conductivity type transistors, wherein each of the current supply circuit includes a current limiting element whose one end is connected to the first power supply line and a second opposite-conductivity type transistor whose other end is connected to the other end of the current limiting element and whose one end is connected to the other end of the first opposite-conductivity type transistor.

According to the present invention, reduction of the layout area can be realized while handling a GCD mode failure.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

Preferred embodiments of the present invention will be now described below in detail with reference to the accompanying drawings.

Figure 1:
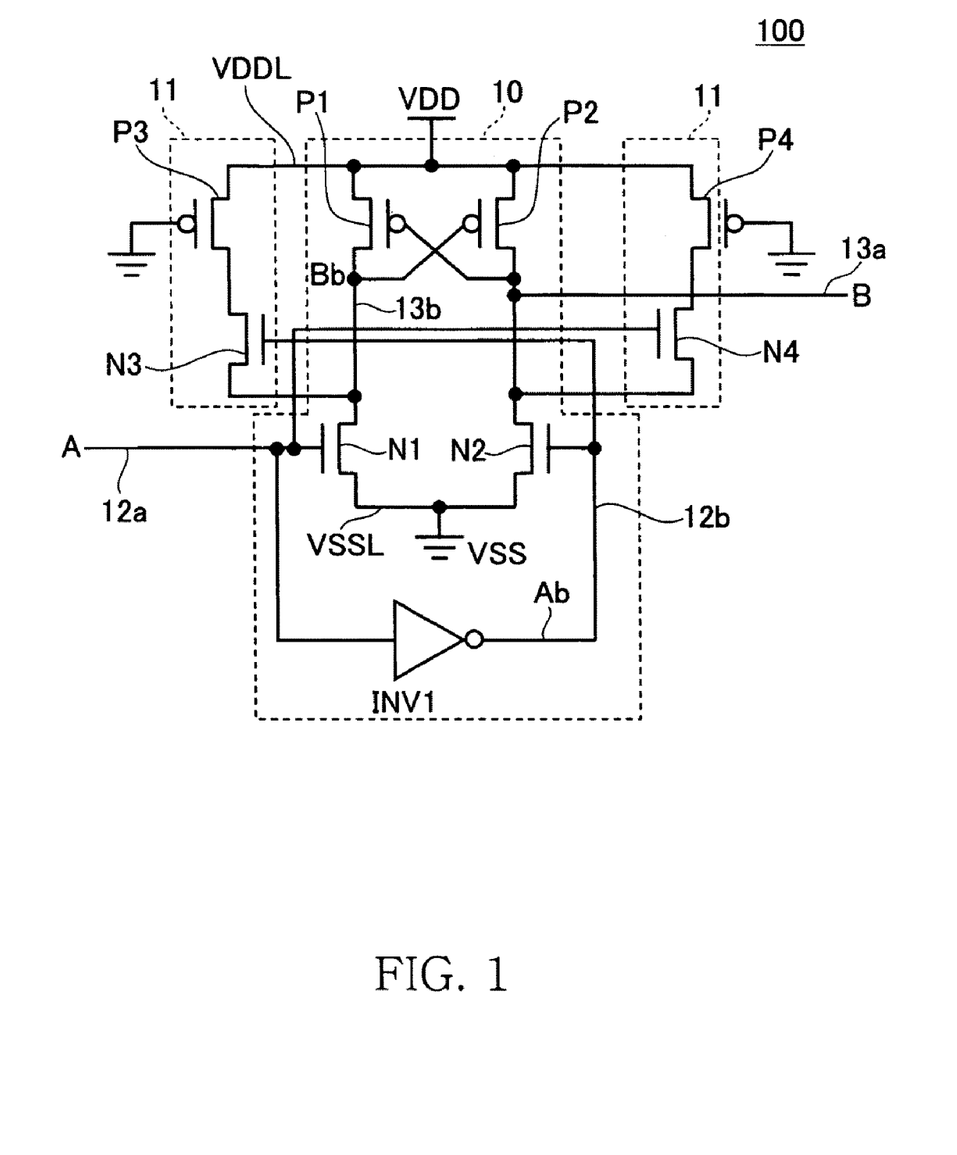
FIG. 1 is a circuit diagram showing a configuration of a level shift circuit 100 according to a first embodiment of the present invention.

FIG. 1 is a circuit diagram showing a configuration of a level shift circuit 100 according to a first embodiment of the present invention.

As shown in FIG. 1, the level shift circuit 100 converts a level of an input signal into a predetermined amplitude level to output a converted signal, and includes a level-shift core circuit 10 and a current supply circuit 11. The level-shift core circuit 10 is constituted by a pair of P-channel transistors P1 and P2, a pair of N-channel transistors N1 and N2, and an inverter INV1.

The transistors P1 and P2 constitute cross-coupled latch circuits connected in a flip-flop manner to each other. A drain (the other end) of the transistor P1 is connected to a gate of the transistor P2 and a drain (the other end) of the transistor P2 is connected to a gate of the transistor P1. Sources (one ends) of the transistors P1 and P2 are connected to a first power supply line VDDL to which a higher power supply potential VDD is supplied.

On the other hand, the transistors N1 and N2 constitute a differential circuit. A drain (the other end) of the transistor N1 is connected to the drain of the transistor P1 and a drain of the transistor N2 is connected to the drain of the transistor P2. Sources (one ends) of the transistors N1 and N2 are connected to a second power supply line VSSL to which a lower power supply potential (a ground potential) VSS is supplied. In this specification, a potential difference between the higher power supply potential VDD and the lower power supply potential VSS is also called "voltage VDD".

An input terminal 12a of the level shift circuit 100 is connected to a gate of the transistor N1. An input signal A with an amplitude level based on an internal operating voltage VPERI is supplied from the input terminal 12a. The input terminal 12a is also connected via the inverter INV1 to a gate of the transistor N2. That is, an inverted input terminal 12b is connected to the gate of the transistor N2. An inverted input signal Ab which is complementary to the input signal A is supplied to the terminal 12b.

An output terminal 13a of the level shift circuit 100 is connected to the drain of the transistor P2 (the drain of the transistor N2). An output signal B whose level is shifted to the external voltage VDD is fetched from the output terminal 13a. An inverted output signal Bb which is complementary to the output signal B can be fetched from the drain of the transistor P1 (the drain of the transistor N1).

The current supply circuit 11 includes a pair of P-channel transistors P3 and P4 and a pair of N-channel transistors N3 and N4. The transistors N3 and N4 have a capability of preventing deterioration in rate of change in output duty caused by lack of drive capability of the P-channel transistors P1 and P2. The transistors P3 and P4 have a capability of suppressing supply of large current to the transistors N3 and N4.

A serial circuit of the transistor P3 and the transistor N3 is inserted between the power supply line VDDL and the drain of the transistor N1 (the drain of the transistor P1) and connected in parallel to the transistor P1. Similarly, a serial circuit of the transistor P4 and the transistor N4 is inserted between the power supply line VDDL and the drain of the transistor N2 (the drain of the transistor P2) and connected in parallel to the transistor P2. Sources of the P-channel transistors P3 and P4 are connected to the power supply line VDDL and their gates are clamped to an on-potential (a ground potential). A drain (the other end) of the transistor N3 is connected to the drain (the other end) of the transistor P3 and a drain (the other end) of the transistor N4 is connected to the drain (the other end) of the transistor P4. The inverted input signal Ab is supplied to a gate of the transistor N3 and the input signal A is supplied to a gate of the transistor N4.

While the level shift circuit 100 according to the first embodiment includes a serial circuit of the N-channel transistors N3 and N1, the transistor N3 is not directly connected to the power supply line VDDL. The P-channel transistor P3 is interposed between the transistor N3 and the power supply line VDDL. While the level shift circuit 100 includes a serial circuit of the N-channel transistors N4 and N2, the transistor N4 is not directly connected to the power supply line VDDL. The P-channel transistor P4 is interposed between the transistor N4 and the power supply line VDDL.

As described above, when the P-channel transistors P3 and P4 serving as current limiting elements are inserted between the power supply line VDDL and the N-channel transistor N3 and between the power supply line VDDL and the N-channel transistor N4, respectively, a large current which causes transistors to be broken flows in a path with lower resistance even when a large surge is overlapped with the power supply line VDDL, which can suppress a flow of a large current in the N-channel transistors N3 and N4.

In a case of a conventional level shift circuit configured only by the level-shift core circuit 10, when VDD is reduced, the rate of change in duty of the output signal B with respect to the input signal A is deteriorated. This is because when the voltage VDD is reduced, the drive capability of the P-channel transistors P1 and P2 is also reduced and thus a difference T1−T2 between a time T1 required for a potential level of the output signal B to be changed from VSS to VDD and a time T2 required for the potential level to be changed from VDD to VSS becomes large. When the current supply circuit 11 is provided in the level-shift core circuit 10; however, the lack of drive capability of the P-channel transistors P1 and P2 is compensated for the N-channel transistors N3 and N4. Therefore, deterioration in output duty can be prevented.

Figure 2:
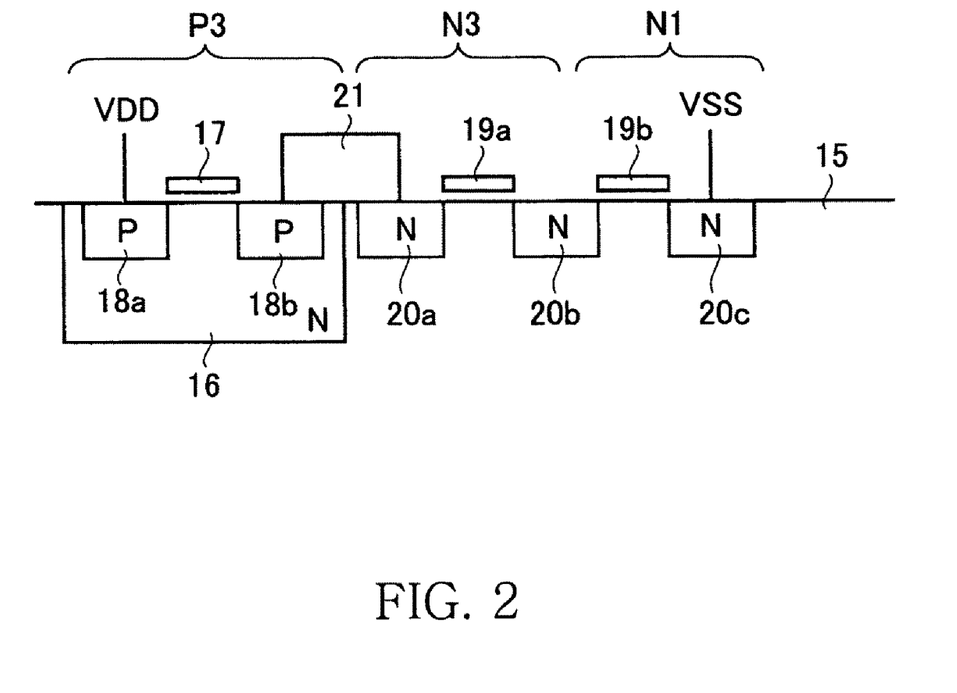
FIG. 2 is a schematic diagram showing device configurations of the transistors P3, N3, and N1 provided between the power supply line VDDL and the power supply line VSSL.

FIG. 2 is a schematic diagram showing device configurations of the transistors P3, N3, and N1 provided between the power supply line VDDL and the power supply line VSSL.

As shown in FIG. 2, an N-well 16 is formed on a P-type substrate 15. The P-channel transistor P3 including a gate 17 and two P-type diffusion layers 18a and 18b is formed in the N-well 16. Two N-channel transistors N3 and N1 including three N-type diffusion layers 20a to 20c are formed on the P-type substrate 15. The N-channel transistor N3 includes a gate 19a and two N-type diffusion layers 20a and 20b. The N-channel transistor N1 includes a gate 19b and two N-type diffusion layers 20b and 20c. The central N-type diffusion layer 20b is shared by the two N-channel transistors N3 and N1 and thus the transistors N3 and N1 are serially connected to each other. The P-type diffusion layer 18b of the P-channel transistor P3 is connected to the N-type diffusion layer 20a of the N-channel transistor N3 by a wiring 21 and thus P-channel transistor P3 is serially connected to the N-channel transistor N3.

In the first embodiment, the power supply line VDDL is not directly connected to N-type diffusion layers of the N-channel transistors N3 and N4. Instead, the power supply line VDDL is connected via the P-channel transistors P3 and P4 to the N-channel transistors N3 and N4. Accordingly, a GCD mode failure can be avoided, the two N-channel transistors N3 and N4 can be connected so as to be adjacent to each other, and the N-type diffusion layer 20b which is one diffusion layer for the transistors N3 and N4 is commonly used to reduce a mounting area.

Figure 3:
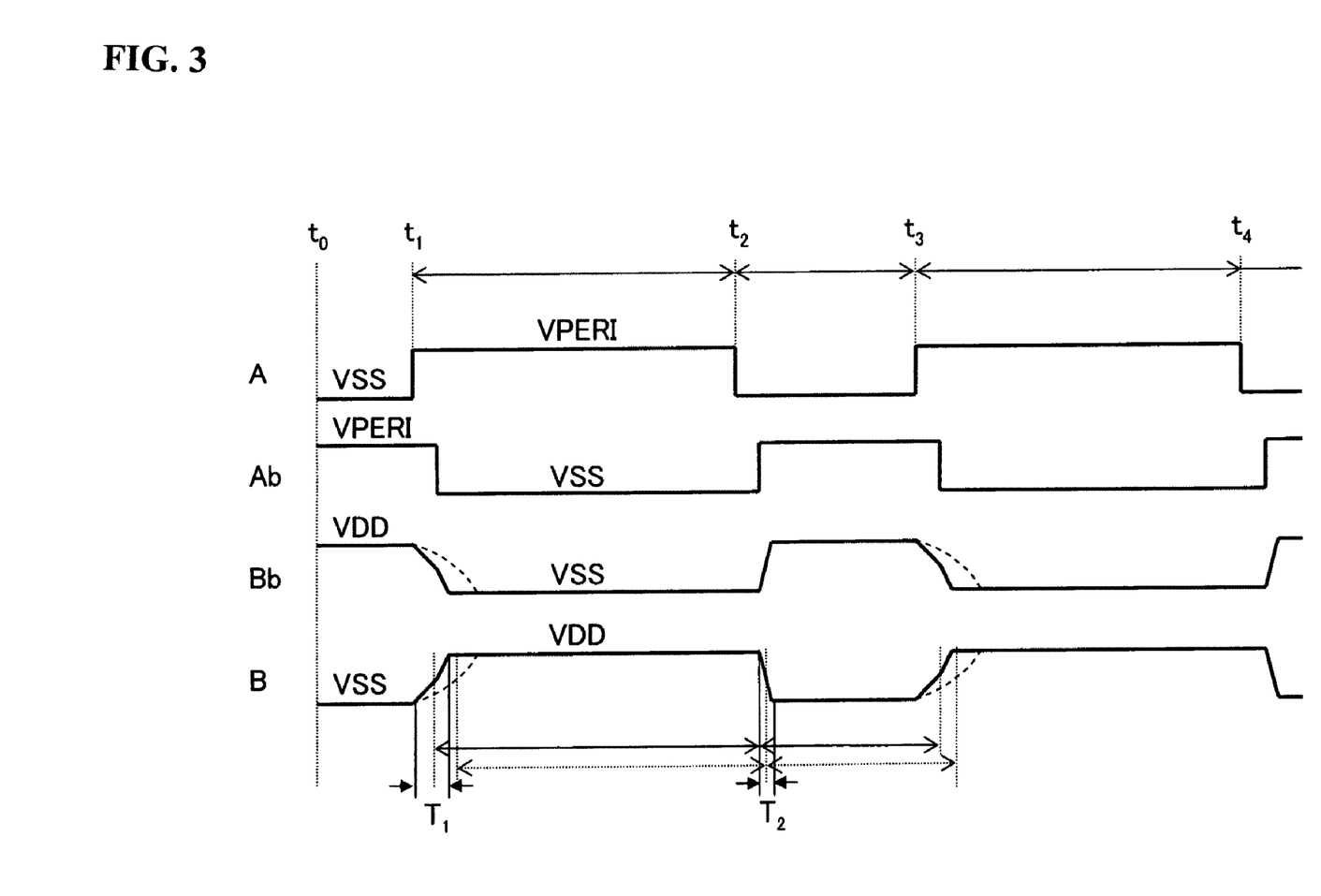
FIG. 3 is a timing chart showing input/output signals to/from the level shift circuit 100.

FIG. 3 is a timing chart showing input/output signals to/from the level shift circuit 100.

As shown in FIG. 3, when the input signal A is supplied to the input terminal 12a of the level shift circuit 100, the inverted input signal Ab which is an inverted signal of the input signal A is supplied to the inverted input terminal 12b. Accordingly, when the input signal A is low level (VSS) at a timing $t_0$, the inverted input signal Ab is high level (VPERI). The output signal B fetched from the output terminal 13a connected to a common contact of the transistors N1, N3, and P1 is low level (VSS). The inverted output signal Bb fetched from an inverted output terminal 13b connected to a common contact of N1, N3, and P1 is high level (VDD).

When the input signal A shifts to high level (VPERI) at a timing $t_1$, the inverted input signal Ab shifts to low level (VSS) and thus the transistor N1 is turned on and the transistor N2 is turned off. The inverted output signal. Bb thus becomes low level (VSS), while the output signal B becomes high level (VDD). When the input signal A shifts to low level (VSS) at a timing $t_2$, the inverted input signal Ab shifts to high level (VPERI). The transistor N1 is thus turned off and the transistor N2 is turned on. Accordingly, the inverted output signal Bb becomes high level (VDD), while the output signal B becomes low level (VSS).

When the external voltage VDD approximates the internal operating voltage VPERI (VDD≈VPERI), the drive capability of the P-channel transistors P1 and P2 is reduced. In a conventional level shift circuit without the current supply circuit 11, gentle rise/fall are provided as shown by broken lines at the timings $t_1$ and $t_3$. When the level-shift core circuit 10 is provided with the current supply circuit 11, the N-channel transistors N3 and N4 can supply voltage to VPERI-Vtn (Vtn is a threshold voltage of an N-channel transistor) and a reduction in drive capability of the P-channel transistors P1 and P2 can be compensated for the N-channel transistors N3 and N4. Specifically, when VDD=1.1 V, VPERI=1.0 V, and Vtn=0.3 V, the voltage that can be supplied by the transistors N3 and N4 is VPERI−Vtn=0.7 V. Because 0.7 V is larger than 0.55 V (=0.5VDD), a logic threshold (=0.5 VDD) for level conversion can be determined by the transistors N3 and N4. The supply capability of P1 and P2 can be compensated for N3 and N4, and the time T1 during which the potential level of the output signal B shifts from VSS to VDD and the time T2 during which the potential level shifts from VDD to VSS are balanced.

When the external voltage VDD is larger than the internal operating voltage VPERI (VDD>VPERI), the drive capability of the P-channel transistors P1 and P2 is not reduced and thus steep rise/fall are provided in the output signal B. Specifically, when VDD=1.81 V, VPERI=1 V, and Vtn=0.3 V, the voltage that can be supplied by the N-channel transistors N3 and N4 is VPERI−Vtn=0.7 V. Although 0.7 V is smaller than 0.9 V (=0.5 VDD) in the N-channel transistors N3 and N4 and does not exceed the logic threshold (=0.5 VDD) for level conversion in the transistors N3 and N4, the source potential of the transistors P1 and P2 is increased to VDD and the drive power of the transistors P1 and P2 is increased. The time T1 during which the potential level of the output signal B shifts from VSS to VDD and the time T2 during which the potential level shifts from VDD to VSS can be balanced.

Figure 4:
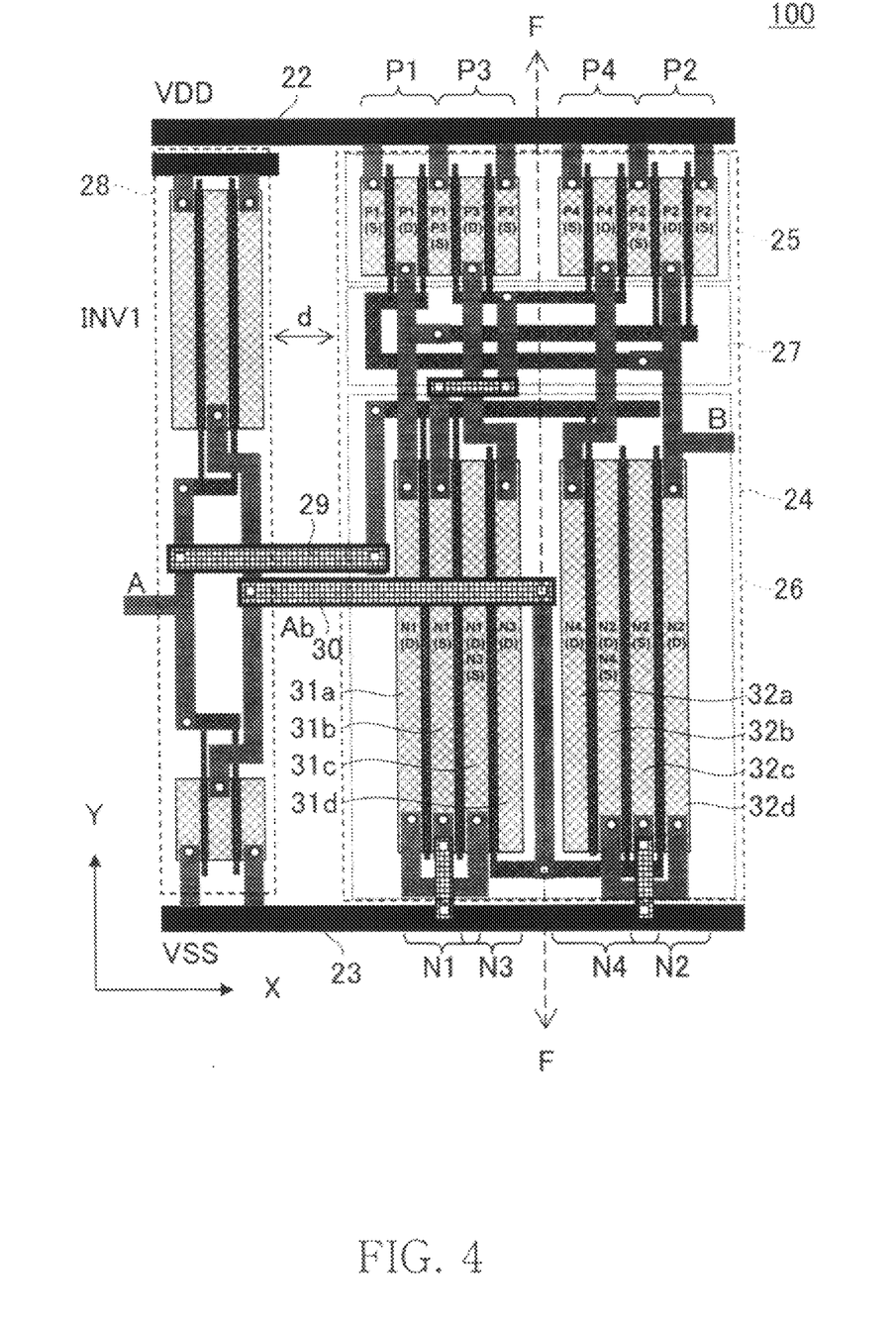
FIG. 4 is a plan view showing an example of layout of the level shift circuit 100 according to the first embodiment.

FIG. 4 is a plan view showing an example of layout of the level shift circuit 100 according to the first embodiment.

As shown in FIG. 4, the level shift circuit 100 includes power supply lines 22 and 23 extending in an X direction, and a transistor region 24 and an inverter region 28 between the power supply line 22 and the power supply line 23. The power supply line 22 is a wiring for supplying the power supply potential VDD and corresponds to VDDL shown in FIG. 1. The power supply line 23 is a wiring for supplying the power supply potential VSS and corresponds to VSSL shown in FIG. 1.

A P-channel transistor region 25, an N-channel transistor region 26, and a wiring region 27 are provided in the transistor region 24. The P-channel transistor region 25 is provided so as to contact the power supply line 22, the N-channel transistor region 26 is provided so as to contact the power supply line 23, and the wiring region 27 is provided between the P-channel transistor region 25 and the N-channel transistor region 26. In the first embodiment, the channel transistor region 25, the N-channel transistor region 26, and the wiring region 27 have a substantially same X direction width.

The P-channel transistors P1 to P4 are formed in the P-channel transistor region 25 and the N-channel transistors N1 to N4 are formed in the N-channel transistor region 26. The transistors P1, P3, N1, and N3 are laid out on the left side of an F-F line of FIG. 4 and the transistors P2, P4, N2, and N4 are laid out on the right side. This coincides with the symmetry of the level shift circuit shown in FIG. 1. Wirings in the wiring region 27 are provided so that the transistors have a connection relationship as shown in FIG. 1. The other end of a wiring whose one end is connected to the drain of the P-channel transistor P1 is not directly connected to the N-channel transistor N3 but to the drain of N3 through the drain of the N-channel transistor N1. The P-channel transistor P2 and the N-channel transistors N2 and N4 have the same relationship.

The inverter INV1 is formed in the inverter region 28. The transistor region 24 and the inverter region 28 are adjacent to each other in the X direction with a predetermined distance d. The transistor region 24 is connected to the inverter region 28 via wirings 29 and 30.

The wiring 29 supplies the input signal A and corresponds to the input terminal 12a shown in FIG. 1. One end of the wiring 29 is connected to an input terminal of the inverter INV1 and the other end of the wiring 29 is connected to gates of the transistors N1 and N4. The wiring 30 supplies the inverted input signal Ab and corresponds to the inverted input terminal 12b shown in FIG. 1. One end of the wiring 30 is connected to an output end of the inverter INV1 and the other end of the wiring 30 is connected to gates of the transistors N2 and N3 (the source of the transistor N4).

The layout of the level shift circuit 100 shown in FIG. 4 is merely an embodiment for describing the present invention and can be more or less different from those of actual circuits. For example, while only one contact plug indicated by a white dot is formed at a predetermined position, a plurality of contact plugs can be provided at that position in actual circuits.

Figure 5:
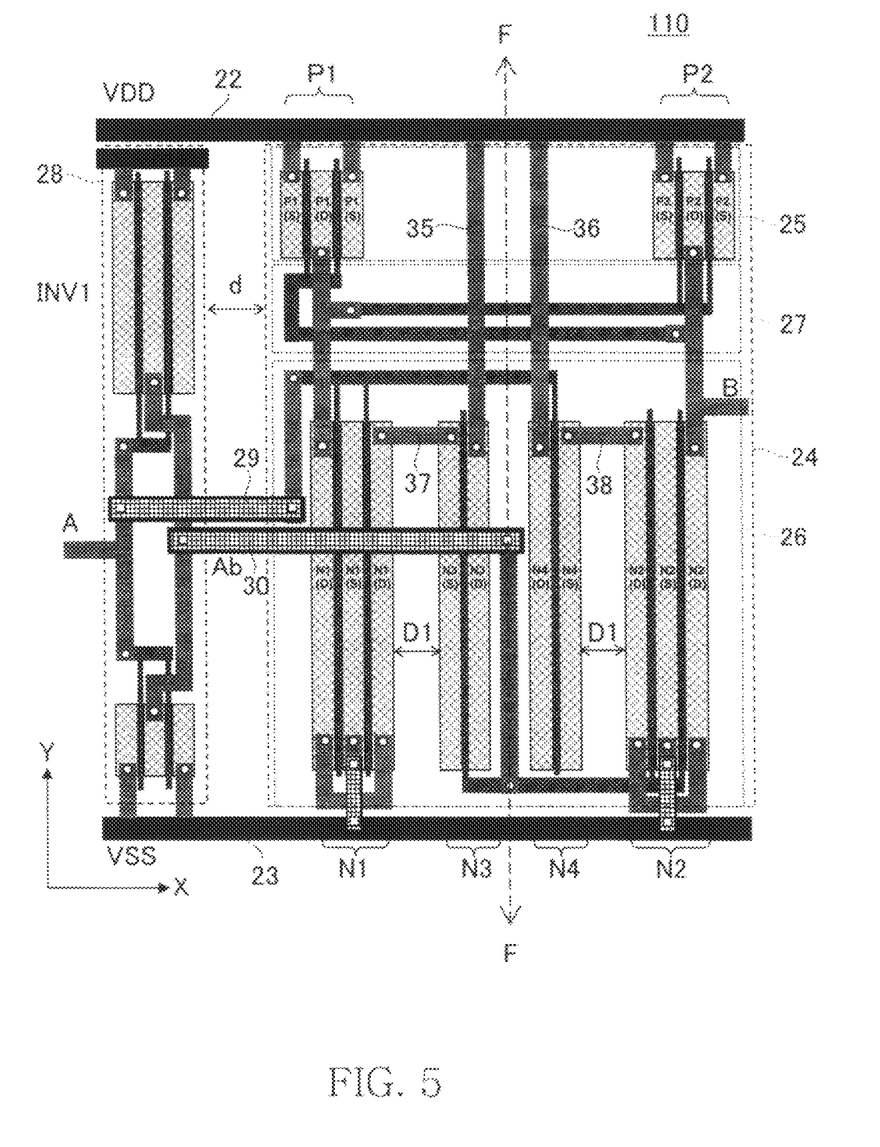
FIG. 5 is a plan view showing a layout of a level shift circuit 110 without the P-channel transistors P3 and P4 while taking a GCD mode failure into consideration.

FIG. 5 is a plan view showing a layout of a level shift circuit 110 without the P-channel transistors P3 and P4 while taking a GCD mode failure into consideration.

As shown in FIG. 5, according to the level shift circuit 110, the P-channel transistors P1 and P2 are formed in the P-channel transistor region 25 but P3 and P4 are not formed. The N-channel transistors N1 to N4 are formed in the N-channel transistor region 26. A source diffusion layer of the N-channel transistor N3 and a source diffusion layer of the N-channel transistor N4 are connected via respective wirings 35 and 36 to the power supply line 22. A drain diffusion layer of the N-channel transistor N3 is serially connected to the N-channel transistor N1 via a wiring 37. A drain diffusion layer of the N-channel transistor N4 is serially connected to the N-channel transistor N2 via a wiring 38.

As described above, because a shorter distance between the transistors N1 and N3 causes a GCD mode failure, a distance D1 is provided between the transistors N1 and N3. The distance D1 is also provided between the transistors N2 and N4. When two N-channel transistors are serially connected to the power supply VDD, the distance between the N-channel transistors N1 and N3 and the distance between N2 and N4 need to be large to a certain extent, and this leads to an increase of the layout as shown in FIG. 5.

In FIG. 4, however, the transistors P3 and P4 are newly provided in a blank space between the transistors P1 and P2 in the P-channel transistor region 25. Accordingly, the space is not enlarged by providing the transistors P3 and P4. On the other hand, because the transistors P3 and P4 are provided and the N-channel transistors N3 and N4 are not directly connected to the power supply line 22, the GCD mode failure can be avoided. The distance between the transistors N1 and N3 and the distance between the transistors N2 and N4 can be short and they can share the diffusion layer.

To explain the sharing of the diffusion layer in detail, in FIG. 4, among four diffusion layers 31a to 31d constituting the transistor N1 and N3, three diffusion layers 31a, 31b, and 31c from left are diffusion layers for the transistor N1 and two diffusion layers 31d and 31c from right are diffusion layers for the transistor N3. The diffusion layer 31c which is a third one from left is shared by the transistors N1 and N3. Similarly, among four diffusion layers 32a to 32d constituting the transistor N2 and N4, three diffusion layers 32d, 32c, and 32b from right are diffusion layers for the transistor N2 and two diffusion layers 32a and 32b from left are diffusion layers for the transistor N4. The diffusion layer 32b which is a third one from right is shared by the transistors N2 and N4. By sharing the diffusion layer as described above, a fine layout is realized and the layout area of the N-channel transistors is reduced. Therefore, even when the P-channel transistors P3 and P4 are added, the level shift circuit can be reduced as a whole.

Figure 6:
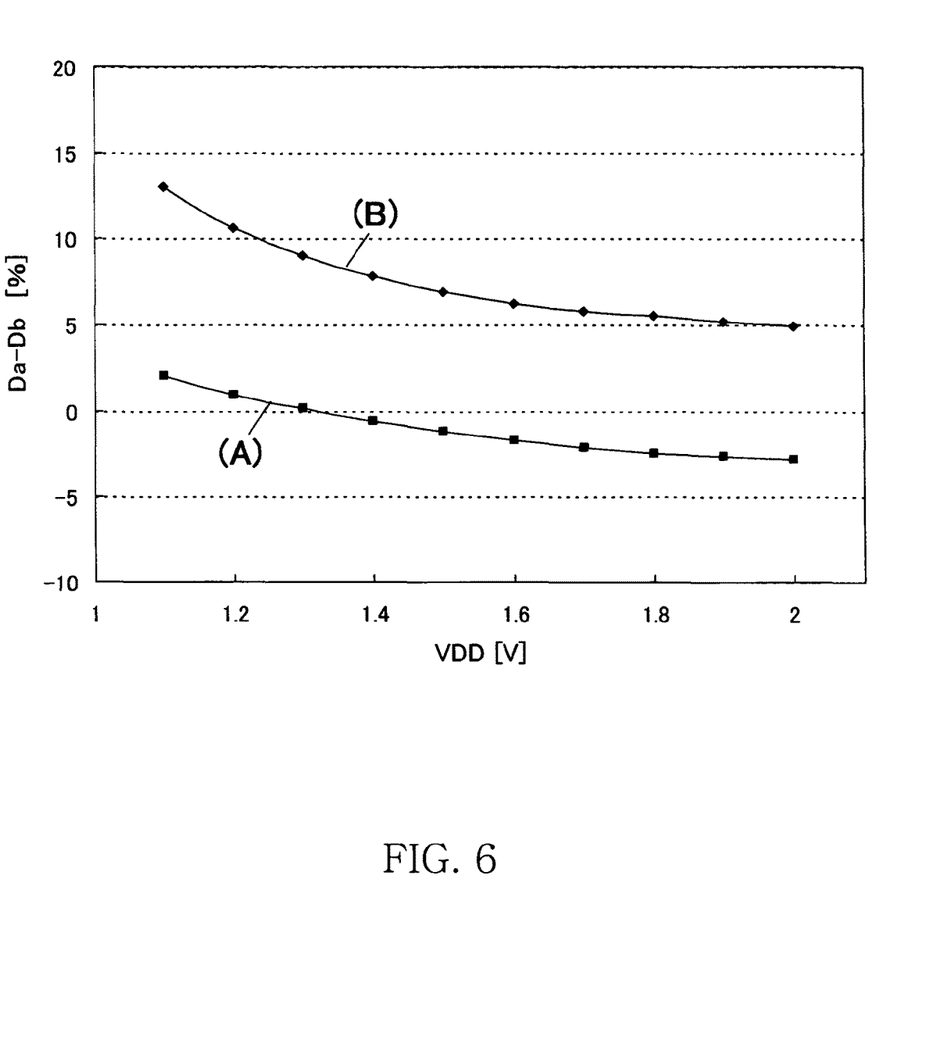
FIG. 6 is a graph showing a level conversion characteristic of the level shift circuit 100.

FIG. 6 is a graph showing a level conversion characteristic of the level shift circuit 100. In FIG. 6, a horizontal axis indicates a potential level of the power supply potential VDD and a vertical axis indicates a difference (Da−Db) between a duty Da (%) of the input signal A and a duty Db (%) of the output signal B. Graph (A) indicates a characteristic of the level shift circuit 100 according to the first embodiment and graph (B) indicates a characteristic of a conventional level shift circuit configured merely by the level-shift core circuit 10. The internal operating voltage VPERI is fixed to 1.0 V (VPERI=1.0 V).

As shown in FIG. 6, according to the conventional level shift circuit, the rate of change in duty is low such as 5% at higher VDD. As VDD is decreased, the rate of change in duty is increased. When VDD=1.1 V, the rate of change in duty becomes worse such as 12.8%. To improve the rate of change in duty, a DLL (Delay Locked Loop) circuit has to be used. However, the DLL circuit requires a correction amount of 10% or more merely for the level shift circuit. The DLL circuit has to be designed so as to ensure a correction amount of 10% or more, which causes the sizes of the DLL circuit to be enlarged.

On the other hand, according to the level shift circuit 100 of the first embodiment, the rate of change in duty is about −2.6% at higher VDD. As VDD is decreased, the rate of change in duty is increased toward a plus side. When VDD=1.1 V, however, the rate of change in duty is about 1.7%. This number is an improved one in view of an absolute value. The change in duty is within ±2.6% in the level shift circuit 100 according to the first embodiment. It is found that deterioration in the rate of change in duty after the level conversion is suppressed. Not only the level shift circuit 100 but also the DLL circuit can be reduced and an entire semiconductor device including the level shift circuit and the DLL circuit can be made compact.

As described above, according to the level shift circuit 100 of the first embodiment, the current supply circuit 11 is constituted by a serial circuit of a P-channel transistor and an N-channel transistor. The P-channel transistor serving as a current limiting element is inserted between the power supply line VDDL and the N-channel transistor. When the power supply potential VDD takes a wide range from a value sufficiently larger than VPERI to a value approximating VPERI, deterioration in duty of an output signal after level conversion can be prevented and the layout area can be reduced while handling a GCD mode failure.

Figure 7:
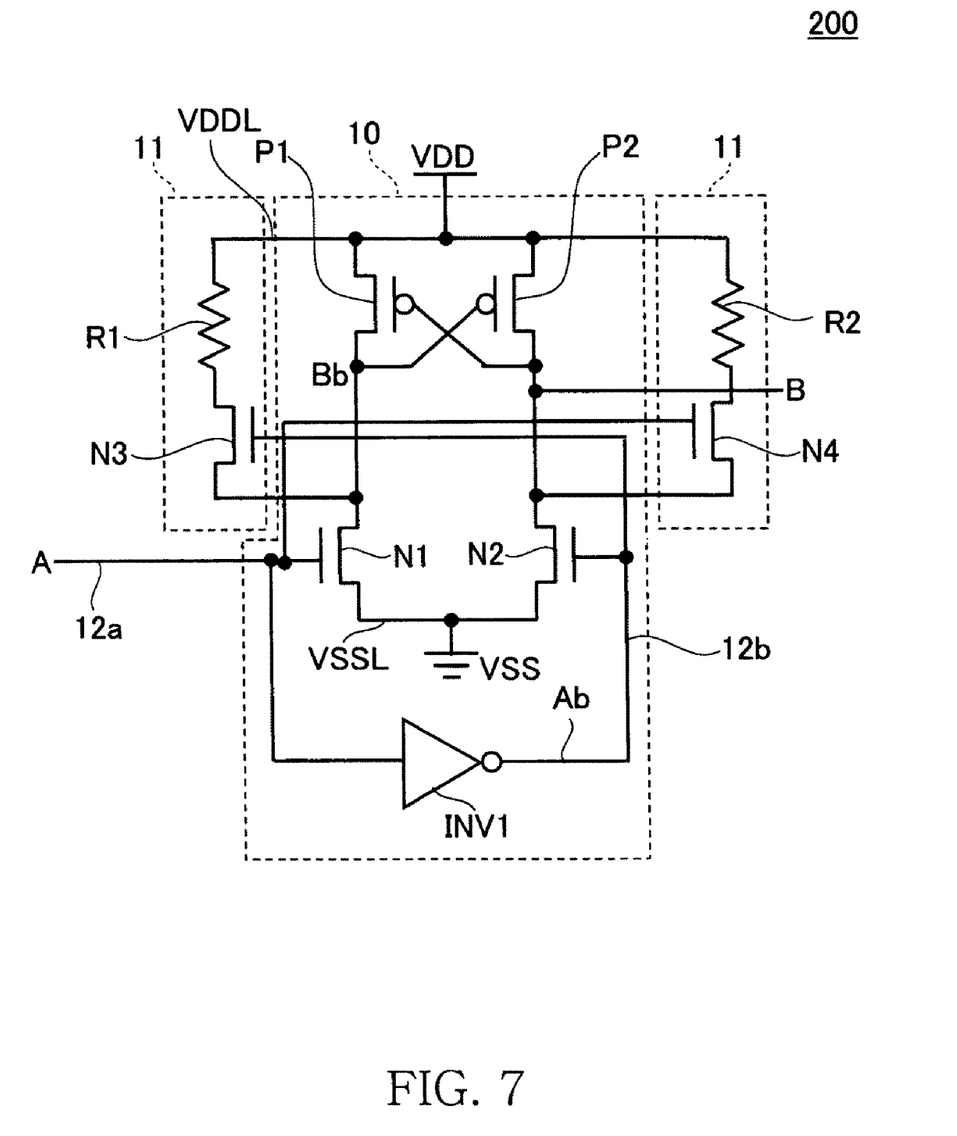
FIG. 7 is a circuit diagram showing a configuration of a level shift circuit 200 according to a second embodiment of the present invention.
Figure 8:
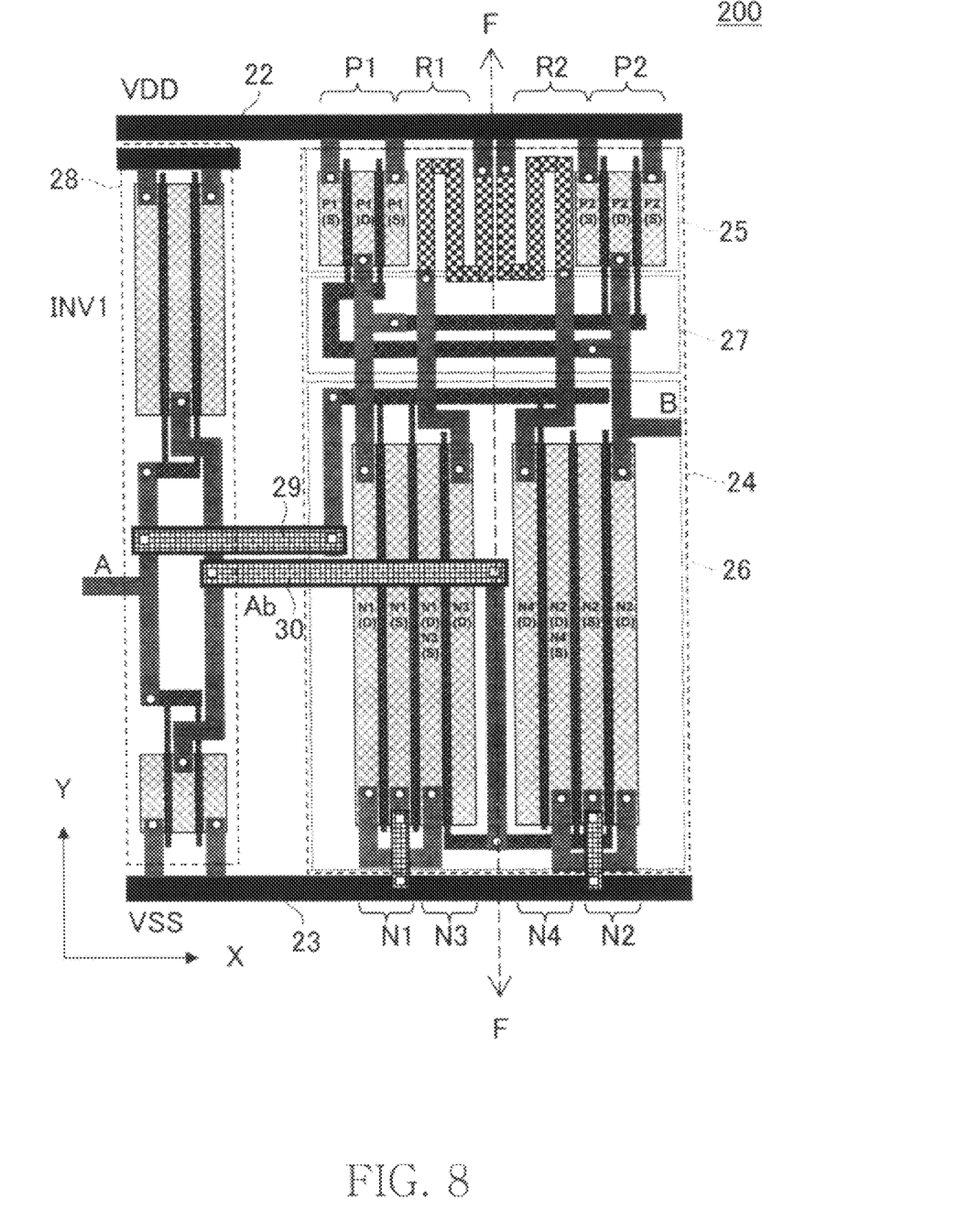
FIG. 8 is a plan view showing an example of layout of the level shift circuit 200.

FIG. 7 is a circuit diagram showing a configuration of a level shift circuit 200 according to a second embodiment of the present invention. FIG. 8 is a plan view showing an example of layout of the level shift circuit 200.

As shown in FIG. 7, the level shift circuit 200 uses resistance elements R1 and R2 instead of the P-channel transistors P1 and P2 in the current supply circuit 11. Examples of materials for the resistance elements R1 and R2 include a high melting point metal such as tungsten (W). As shown in FIG. 8, the resistance elements R1 and R2 are formed as, for example, a meander pattern in the region where the transistors P2 and P4 are formed in FIG. 4. Even in such a configuration, the N-channel transistors N3 and N4 are not directly connected to the power supply line 22 (VDDL). Accordingly, the GCD mode failure can be avoided and the layout area can be reduced.

It is apparent that the present invention is not limited to the above embodiments, but may be modified and changed without departing from the scope and spirit of the invention.

For example, while the above embodiments have described a level shift circuit as an example of a semiconductor circuit in which a serial circuit of two N-channel transistors is serially connected to VDD, the present invention is not limited to level shift circuits and can be applied to semiconductor circuits in which a serial circuit of two N-channel transistors is directly connected to VDD. In the level shift circuit according to the above embodiments, even when a P-channel transistor is added between one end of the serial circuit of two N-channel transistors and VDD, the layout area is not increased. On the contrary, the level shift circuit of the present invention has a specific effect such that an N-type diffusion layer is shared by two N-channel transistors and thus the circuit size can be reduced.

Further, it suffices that transistors in the above embodiments are field effect transistors (Field Effect Transistors: FET). In addition to a MOS (Metal Oxide Semiconductor), various FETs such as a MIS (Metal-Insulator Semiconductor) and a TFT (Thin Film Transistor) can be used and field effect transistors other than these transistors can be also used. Further, not only P-type semiconductor substrates but also N-type semiconductor substrates can be used, and SOI (Silicon on Insulator) semiconductor substrates and semiconductor substrates other than these substrates can be also used.

Furthermore, the present invention can be applied to semiconductor devices in general, such as a DRAM as a semiconductor memory device and a CPU (Central Processing Unit), a MCU (Micro Control Unit), a DSP (Digital Signal Processor), an ASIC (Application Specific Integrated Circuit), or an ASSP (Application Specific Standard Circuit), each of which has an information storage function.

What is claimed is:
1. A device comprising:
first and second power supply lines;

first, second, third and fourth nodes;
a first transistor of a first conductivity type coupled between the first power supply line and the first node and having a control electrode coupled to the second node;
a second transistor of the first conductivity type coupled between the first power supply line and the second node and having a control electrode coupled to the first node;
a third transistor of a second conductivity type coupled between the first node and the second power supply line and having a control electrode;
a fourth transistor of the second conductivity type coupled between the second node and the second power supply line and having a control electrode;
a first current limiting element coupled between the first power supply line and the third node;
a second current limiting element coupled between the first power supply line and the fourth node;
a fifth transistor of the second conductivity type coupled between the first and third nodes and having a control electrode coupled to the control electrode of the fourth transistor; and
a sixth transistor of the second conductivity type coupled between the second and fourth nodes and having a control electrode coupled to the control electrode of the third transistor,
wherein an input signal is supplied to the control electrode of the third transitor, an inverted signal of the input signal is supplied to the control electrode of the fourth transitor, and an output signal is derived from at least one of the first and second nodes.

2. The device as claimed in claim 1, wherein
the first current limiting element comprises a seventh transistor of the first conductivity type having a control electrode supplied with a predetermined potential so as to keep the seventh transistor ON state, and
the second current limiting element comprises an eighth transistor of the first conductivity type having a control electrode supplied with the predetermined potential so as to keep the eighth transistor ON state.

3. The device as claimed in claim 1, wherein each of the first and second current limiting elements comprises a resistance element made of a refractory metal material.

4. The device as claimed in claim 1, wherein
a diffusion layer of the third transistor connected to the first node and a diffusion layer of the fifth transistor connected to the first node are shared, and
a diffusion layer of the fourth transistor connected to the second node and a diffusion layer of the sixth transistor connected to the second node are shared.

5. The device as claimed in claim 1 further comprising:
a transistor forming region having substantially rectangular shape that is interposed between the first and second power supply lines extending in a first direction;
a first conductivity type transistor region having substantially rectangular shape provided to be adjacent to the first power supply line in the transistor forming region;
a second conductivity type transistor region having substantially rectangular shape provided to be adjacent to the second power supply line in the transistor forming region; and
a wiring region provided between the first conductivity type transistor region and the second conductivity type transistor region in the transistor forming region, wherein
the first and second transistors are formed in the first conductivity type transistor region,
the third to sixth transistors are formed in the second conductivity type transistor region, and
a width of the first conductivity type transistor region in the first direction is substantially equal to a width of the second conductivity type transistor region in the first direction.

6. The device as claimed in claim 5, wherein
the third and fifth transistors are arranged closely in the first direction in the second conductivity type transistor region, and
the fourth and sixth transistors are arranged closely in the first direction in the second conductivity type transistor region.

7. The semiconductor device as claimed in claim 1, wherein the first conductivity type is a P-channel type and the second conductivity type is an N-channel type.

8. A device comprising:
a first power supply line that supplies a first potential;
a second power supply line that supplies a second potential, which is lower than the first potential;
first and second P-channel transistors which are cross-coupled and whose sources are connected to the first power supply line;
a first N-channel transistor that is provided between a drain of the first P-channel transistor and the second power supply line and an input signal is supplied to its gate electrode;
a second N-channel transistor that is provided between a drain of the second P-channel transistor and the second power supply line and an inverted input signal which is complementary to the input signal is supplied to its gate electrode;
a first current supply circuit that is connected in parallel to the first P-channel transistor and supplies a current in a path different from that of the first P-channel transistor to the first N-channel transistor; and
a second current supply circuit that is connected in parallel to the second P-channel transistor and supplies a current in a path different from that of the second P-channel transistor to the second N-channel transistor, wherein
the first current supply circuit includes a third N-channel transistor whose source is connected to a drain of the first N-channel transistor and a first current limiting element whose one end is connected to the first power supply line and whose other end is connected to a drain of the third N-channel transistor,
the second current supply circuit includes a fourth N-channel transistor whose source is connected to the drain of the second N-channel transistor and a second current limiting element whose one end is connected to the first power supply line and whose other end is connected to a drain of the fourth N-channel transistor,
the inverted input signal is supplied to a gate electrode of the third N-channel transistor, and
the input signal is supplied to a gate electrode of the fourth N-channel transistor.

9. The device as claimed in claim 8, wherein the first and second current limiting elements comprise third and fourth P-channel transistors, respectively, whose gate electrodes are clamped so as to keep the third and fourth P-channel transistor ON state.

10. The device as claimed in claim 9, further comprising:
a transistor forming region having substantially rectangular shape that is interposed between the first and second power supply lines extending in a first direction;

a P-channel transistor region having substantially rectangular shape provided to be adjacent to the first power supply potential wiring in the transistor forming region;

a N-channel transistor region having substantially rectangular shape provided to be adjacent to the second power supply potential wiring in the transistor forming region; and a wiring region provided between the P-channel transistor region and the N-channel transistor region in the transistor forming region, wherein the first to fourth P-channel transistors are formed in the P-channel transistor regions, the first to fourth N-channel transistors are formed in the N-channel transistor region, and a width of the P-channel transistor region in the first direction is substantially equal to a width of the N-channel transistor region in the first direction.

11. The device as claimed in claim 10, wherein the first N-channel transistor and the third N-channel transistor are closely arranged in the first direction in the N-channel transistor region, and the second N-channel transistor and the fourth N-channel transistor are closely arranged in the first direction in the N-channel transistor region.

12. The device as claimed in claim 8, wherein the first and second current limiting elements comprise first and second resistance elements, respectively, made of a refractory metal material.

13. The device as claimed in claim 8, wherein the drain of the first N-channel transistor and the source of the third N-channel transistor are shared, and the drain of the second N-channel transistor and the source of the fourth N-channel transistor are shared.

* * * * *